United States Patent [19]

Hunt

[11] 4,190,019
[45] Feb. 26, 1980

[54] VACUUM METALLIZING INTERIOR OF HOLLOW ARTICLE WITH MASKING SHIELD

[76] Inventor: Claude J. L. Hunt, Hinton Hall, Peterchurch, Herefordshire, England

[21] Appl. No.: 833,340

[22] Filed: Sep. 14, 1977

[30] Foreign Application Priority Data

Sep. 18, 1976 [GB] United Kingdom ............... 38768/76
Mar. 25, 1977 [GB] United Kingdom ............... 12554/77

[51] Int. Cl.² .......................... B44D 1/34; C23F 1/34
[52] U.S. Cl. .................................. 118/720; 118/715; 118/721; 118/724; 118/50; 118/50.1; 427/238
[58] Field of Search .......................... 118/49, 49.1, 49.5, 118/50, 720, 721, 724, 715; 427/237, 236, 237

[56] References Cited

U.S. PATENT DOCUMENTS

| | | | |
|---|---|---|---|
| 1,621,016 | 3/1927 | Jackson | 427/238 X |
| 2,160,714 | 5/1939 | Biggs | 118/49 |
| 2,508,509 | 5/1950 | Germer et al. | 118/49 |
| 2,730,987 | 1/1956 | Nelson | 118/49 |
| 3,246,627 | 4/1966 | Loeb et al. | 118/49 |
| 3,277,864 | 10/1966 | Hopstaken | 118/720 |
| 3,561,920 | 2/1971 | Kinter et al. | 427/238 X |
| 3,598,957 | 8/1971 | Yasuda et al. | 118/720 |
| 3,623,854 | 11/1971 | Frank | 118/49 X |
| 3,748,169 | 7/1973 | Keller | 118/49 X |
| 3,751,539 | 8/1973 | Reuschel et al. | 118/49 X |
| 3,752,691 | 8/1973 | Little | 118/720 X |
| 3,804,059 | 4/1974 | Streel | 118/49 |
| 3,913,520 | 10/1975 | Berg et al. | 118/720 X |
| 3,915,117 | 10/1975 | Schertler | 118/49 |
| 3,952,118 | 4/1976 | Novice | 118/49 X |
| 3,962,670 | 6/1976 | Dietze | 118/49 X |
| 4,036,171 | 7/1977 | Ramet | 118/720 |

*Primary Examiner*—Edward C. Kimlin
*Attorney, Agent, or Firm*—Wender, Murase & White

[57] ABSTRACT

A vacuum metallizing apparatus and method for coating the inside of hollow articles, e.g. tap control knobs, in which the article is engaged with a seating of a hollow body so that the interior of the article and the hollow body define a chamber in which high vacuum can be induced through the hollow body. A heating assembly is mounted in the hollow body for vaporizing the coating metal. The heating assembly is enclosed by a shield and may be associated with a shutter that is movable to interfere with deposition inside the article for certain coating metals.

9 Claims, 5 Drawing Figures

VACUUM METALLIZING INTERIOR OF HOLLOW ARTICLE WITH MASKING SHIELD

BACKGROUND OF THE INVENTION

This invention concerns improvements in or relating to vacuum metallising, in particular, to the metallising of the internal surfaces of hollow plastics articles such as the interior of tap knob bodies, control knobs, handles or the like.

It is already well known to employ vacuum metallising for coating the outside of plastics articles with metal elements such as aluminum, silver, gold etc. In the known process, the articles to be coated are placed in a vacuum chamber and the metal element is vaporized by electrical heating when the chamber is at high vacuum. The metal element is deposited on the outside of the articles due to the dispersion of the atoms of the vaporized metal. However, this process and apparatus cannot be used for internal surface coating because an even coating cannot be achieved, in particular on small surfaces like internal bores such as in tap bodies or control knobs.

Additionally, with small articles it is uneconomic to use a large vacuum chamber, despite multiple jig fixtures as there is substantial wastage of the metal element, which may be gold, and the pumping loads for inducing high vacuum are such as to lead to inefficient operation. Furthermore, there is always the necessity to batch up the articles for mounting on the jig, and this can interfere with efficient production rates.

SUMMARY OF THE INVENTION

Accordingly, this invention is intended to overcome the foregoing problems by providing a simple method and apparatus for vacuum metallising the interior of plastics articles especially small articles.

In one aspect of this invention, I provide in the process vacuum metallising of hollow articles the improvement of inducing a high vacuum inside the article by connecting the article to a high vacuum source and subsequently vaporising the coating metal adjacent to the connection so that the interior of the article is coated, then releasing the high vacuum to permit disconnection of the internally coated article.

According to another aspect of this invention, I provide apparatus for carrying out said process, the apparatus comprising a hollow body connected to a high vacuum source and having a seating face to connect the interior of the article to the hollow body whilst high vacuum is induced in the hollow body and the interior of the article, and a heating assembly mounted in the hollow body for vaporising the coating metal disposed in the hollow body.

It will be realised that the concept employed in my invention is to use the article to be coated to define, at least part, of the vacuum chamber in which the coating metal is vaporised for deposition. My apparatus comprises in its simplest form, an evaporation unit comprising the hollow body of minimum volume in which the high vacuum is induced and to which the article is connected and which has a heating assembly for vaporising the coating metal.

Furthermore, by this invention the volume to be reduced to high vacuum can be kept to a minimum, which may be regarded as a chamber merely sufficient to permit adequate vaporisation and dispersion of the metal element atoms for coating. This is a significant advance over the known methods and apparatus in which the article is put into a large chamber which has to be reduced to high vacuum and for which the ratio of chamber volume/coating area can be more than 50 times greater than the ratio for the present invention. Of course the high vacuum pumping capacity required is a major factor in determining cost and cycle times so that there are inherent advantages in any arrangements which reduce the volume to be reduced to high vacuum and these are appreciated in this field.

Preferably, the article is engaged with a seating face on a hollow body in which high vacuum is induced and the article is drawn into sealing engagement with said seating face by such vacuum. The hollow body may have more than one seating face so that more than one article can be coated simultaneously. The seating(s) may be changeable to complement a wide range of articles.

The process for vacuum metallising employs the known cycle for vacuum metallising processing in which under high vacuum the metal element is vaporised and deposited on the surface of the article to be coated, the coated article then being released from high vacuum. However, I can provide apparatus comprising the evaporation unit which can be connected to an existing high vacuum source, such as the high vacuum chamber of a fixed large plant, or can be part of a self-contained apparatus that is small and compact with small pumps because the pumping requirements for inducing high vacuum are significantly lower because of the small volume.

The hollow body of the evaporation unit therefore has its own heating assembly which is arranged to extend within the hollow body and which can be loaded with the coating metal to be vaporised inbetween each cycle.

Preferably, the filament of the heating assembly is arranged to extend in substantial alignment with the seating(s) so as to be adjacent thereto. The heating assembly further comprises a shield which is an apertured sleeve covering the filament with the aperture(s) being arranged relative to the seating(s) so that the vaporised coating metal is directed to impinge on the interior surface of an article seated on a respective seating. Other features related to the shield are discussed later.

In certain circumstances, such as for coating with gold, there is a tendency for any impurity elements to be vaporised first and this can adversely effect the coating. Thus the hollow body may include a shutter movable to obstruct the passage of the atoms to the interior of the article for a short time during the initial firing of the filament, and the shutter is released only when the pure metal is being vaporised.

Other features and technical advances of my invention will be described later in relation to preferred embodiments and modifications.

DESCRIPTION OF THE PREFERRED EMBODIMENT

Figure 1:
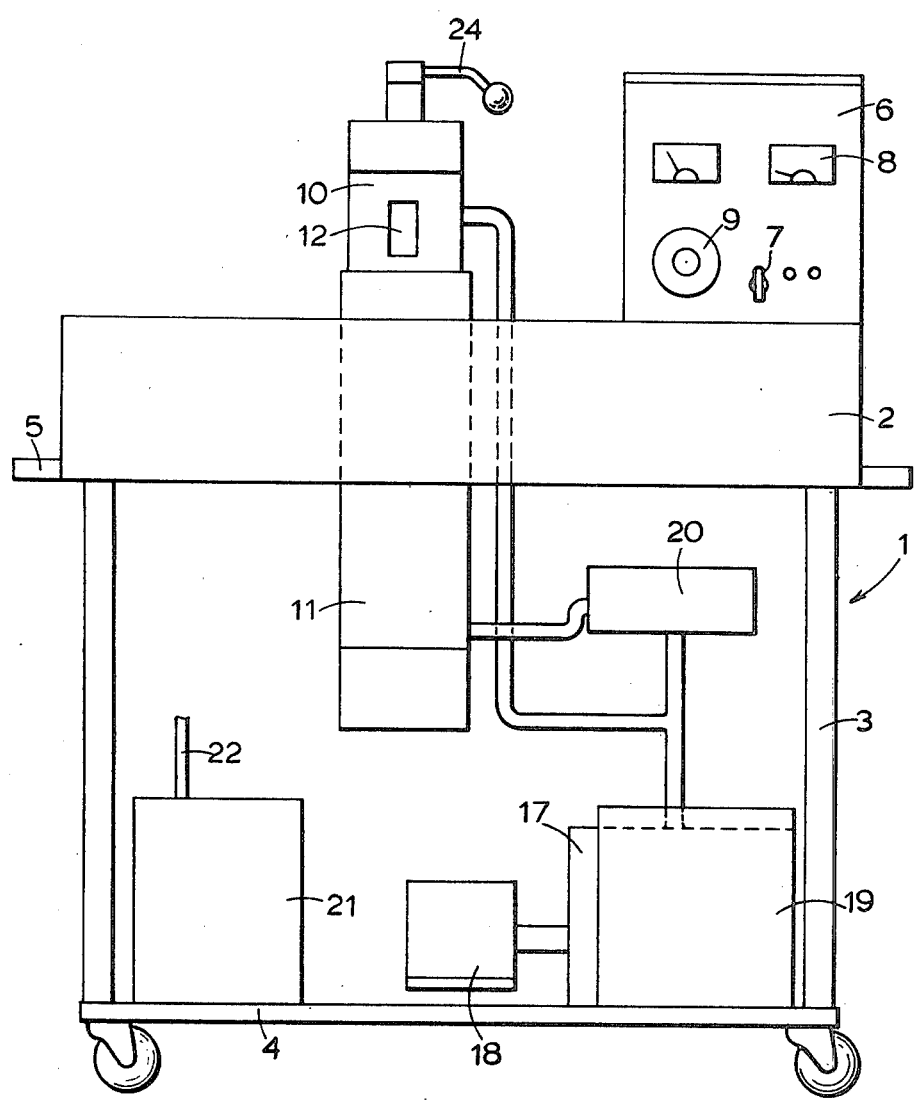
FIG. 1 is a schematic front view of a preferred embodiment of a portable vacuum metallising apparatus according to the present invention, omitting the evaporation unit.
Figure 2:
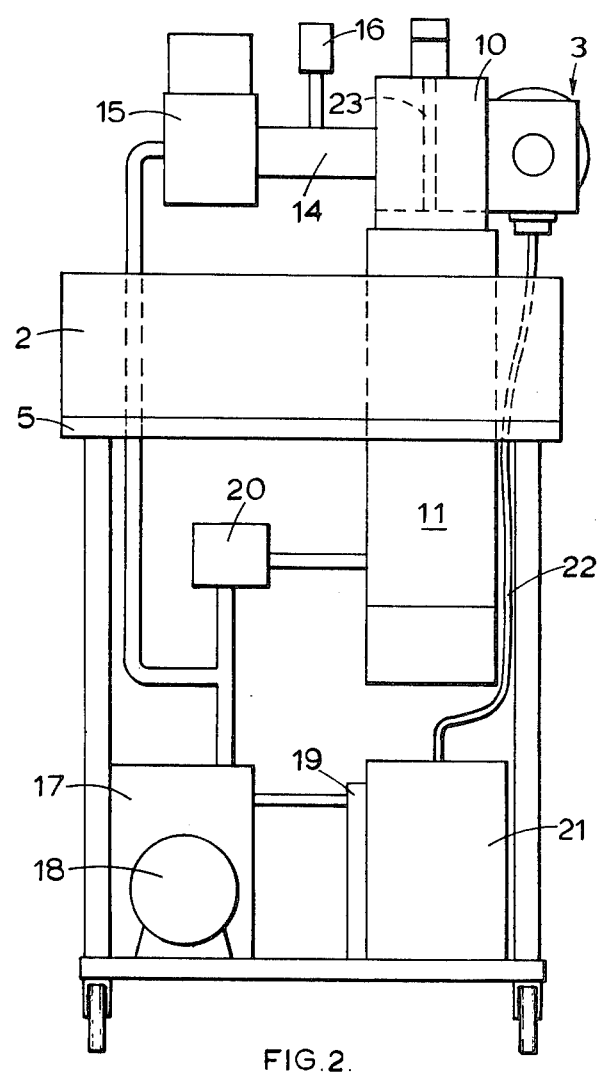
FIG. 2 is a schematic side view of the apparatus of FIG. 1 with the evaporation unit being indicated in outline.

With reference to FIGS. 1 and 2, the apparatus comprises a portable stand 1 including a bench 2 supported on a wheeled frame 3 with a lower shelf 4 beneath the bench. For convenience the frame includes handles 5. The bench 2 has a control panel 6 mounted on one side with a control switch 7, gauges 8 for visibly displaying respectively high and low vacuum, variable transformer 9 and other indicators or controls as may be appropriate or desired including a sequence controller for automatic programming of the cycle.

The bench supports a hollow cylindrical isolation valve body 10 which is mounted on an oil diffusion pump 11. The valve body 10 has a front port 12 for co-operation with the evaporation unit 13 mounted on the body 10 and to be described later. Opposed to the front port 12 is a rear port connected by a duct 14 to a roughing valve 15, there being an air admittance valve 16 connected in the duct.

The roughing valve 15 is connected to a mechanical vacuum arrangement disposed on the lower shelf 4. The mechanical pump 17 is driven by an electric motor 18 and is connected to an exhaust box 19 to trap exhausted oil from the pump. Additionally, the mechanical pump 17 is connected to a backing valve 20 connected to the high vacuum oil diffusion pump 11. A transformer 21 with leads 22 for connection to the evaporation unit 13 is also mounted on the shelf and would be connectable to a mains electric supply as would be the other parts aforementioned in known manner which is not illustrated and described.

The roughing valve 15 is operable by the controls to open or close the connection of the isolation valve to the mechanical vacuum pump 17. The roughing valve 15 is preferably an electromagnetic valve which drops to close such connection on power failure to isolate both of the pumps from air admittance. The air admittance valve 16 is controlled to admit air as required into the isolation valve body 10 including admittance under power failure.

The isolation valve body 10 has an axially movable valve member 23 inside (shown schematically in FIG. 2) for closing the communication of the valve body to the oil diffusion pump 11 in which closed position the valve body is exhausted through the roughing valve 15 when it is open. The isolation valve member 23 is movable into an upper, open position in which the front port is cleared by the valve member so that the isolation valve body 10 and the evaporation unit 13 communicating with the front port 12 is exhausted to high vacuum by the oil diffusion pump 11. In this open position of the isolation valve member, the roughing valve 15 would be closed.

The isolation valve member 23 is of the poppet type and is operable by a rotatable control arm 24 which is connected to the valve stem and is arranged to lift or lower the isolation valve member 23 on movement of the control arm. Alternatively, the isolation valve member could also be an electro-magnetic valve operable through the control system with the same failsafe closing feature as the roughing valve.

The apparatus just described is arranged to provide a high vacuum source to which the evaporation unit is connected.

Figure 3:
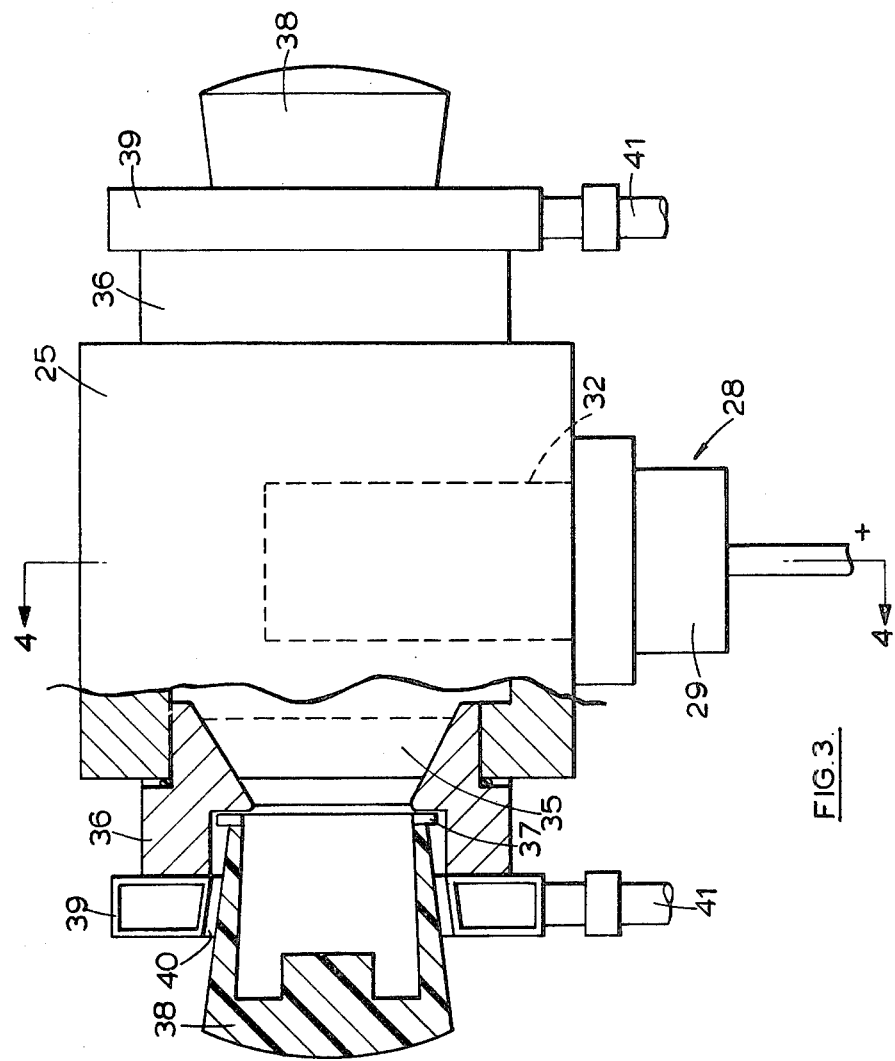
FIG. 3 is a front view partly sectioned and to an enlarged scale, of the evaporation unit.
Figure 4:
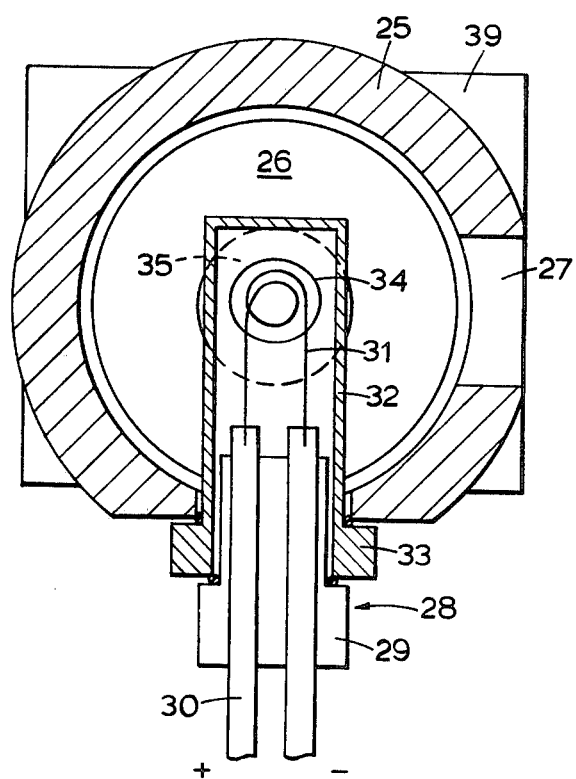
FIG. 4 is a schematic section of FIG. 3 on line 4—4.

The evaporation unit 13 is depicted in FIGS. 3 and 4 and is suitable for vacuum metallising with aluminum. The unit 13 comprises a substantially cylindrical hollow body 25 and the interior provides a vacuum chamber 26. The body has a rear port 27 which is arranged to be seated on the front port 12 of the isolation valve body 10. The unit is clamped or secured to the isolation valve body by any convenient arrangement, such as bolts, clamping straps but these are not shown for clarity of describing and illustrating the essential parts of the evaporation unit.

The body 25 has a through bore in the lower portion through which a heating assembly 28 extends. The heating assembly 28 comprises an insulator block 29 of stepped cylindrical shape through which the positive and negative conductors 30 extend, the conductors 30 being connected to the transformer 21 by the leads 22. A spiral wound tungsten wire filament 31 is connected to the conductors 30 and the wound part of the filament is arranged to support or carry the metal element (not shown) to be vaporised. A flanged tubular sleeve 32 is seated over the insulator block 29 with the flange 33 being in sealing engagement with the body and the shoulder of the insulator block, suitable flexible seals being interposed. The sleeve 32 is closed at one end and provides a shield extending over and enclosing the filament 31. The sleeve 32 is formed with two transverse apertures 34 which are aligned with the wound part of the filament 31 and openings 35 at each end of the body.

The openings 35 at each end of the body 25 are formed by through bores in each of which a seating ring 36 is supported in sealing engagement. The seating ring 36 has an annular seating face on which a resilient seal ring 37 is disposed and the peripheral edge of a hollow plastics tap knob 38 seats thereon. The seating ring 36 is clamped to the body 25 by a plate 39 which has a tapered circular opening co-axial with the seating face. The taper face 40 serves as a guide to ensure that the knob 38 is correctly aligned when inserted to engage the seating ring 37. The plate is hollow and water cooled through coolant supply connections 41. The plate is clamped by bolts (not shown) to the body 25 and the seating ring 36 and seal ring 37 assembly can be changed to accommodate different sizes of knob or other hollow article to be coated.

The seating ring may also be hollow and water cooled, and in this case the plate may be solid, or also water cooled. As will also be appreciated the hollow body could also be water cooled, or it could be finned to aid heat dissapation by air cooling.

The heating assembly 28 including the shield 32 is dismountable from the body 25, and the apertures 34 in the shield are such as to allow the metal element to be loaded onto the filament 31. However, the shield can be removed from the insulator block for cleaning or replacement, and it may be coated internally with graphite to assist cleaning. The shield 32 is preferably made from a material which is a good heat conductor, such as copper. This shield also provides a heat barrier around the filament which avoids local or excessive heating of the hollow plastic article that is being coated through heat dissapation from the filament.

The shield also serves to enclose the filament 31 but the apertures 34 are arranged so that when the metal element is vaporised under high vacuum condition, the atoms escape from the environs of the filament through the apertures and can impinge directly on the interior surface of the respective hollow articles on the seatings. The shield prevents excessive undesirable deposition of vaporised metal on the internal surface of the body.

The shield in combination with the insulator block also provides a trap or container in which dust, metal or other debris from the filament or the metal element being used is caught and contained so that this debris is not induced through the valves and pumps of the high vacuum source.

In use of the apparatus with the evaporation unit connected, the operation is cyclic with both the mechanical and oil diffusion pumps working, the isolation and roughing valves being closed with the unit body open to atmosphere. The heating assembly is loaded with the metal element and inserted and clamped as necessary. A pair of hollow articles are disposed, one on each seating and the roughing valve is opened. This reduction in pressure pulls the articles onto the flexible seal rings. At the appropriate vacuum, the roughing valve closes and the isolation valve is opened to bring the interiors of the body and the articles to high vacuum by the oil diffusion pump.

At the required high vacuum, the electrical control provides power to the filament to heat and vaporise the metal element to coat the interior faces of the articles. After this, the isolation valve is closed and air is admitted to the chamber to permit the coated articles to be released from their seatings. The cycle is then recommenced.

The opening and closing of the valves and the firing of the filament of the heating assembly can be controlled by a sequence controller for automatic operation.

Figure 5:
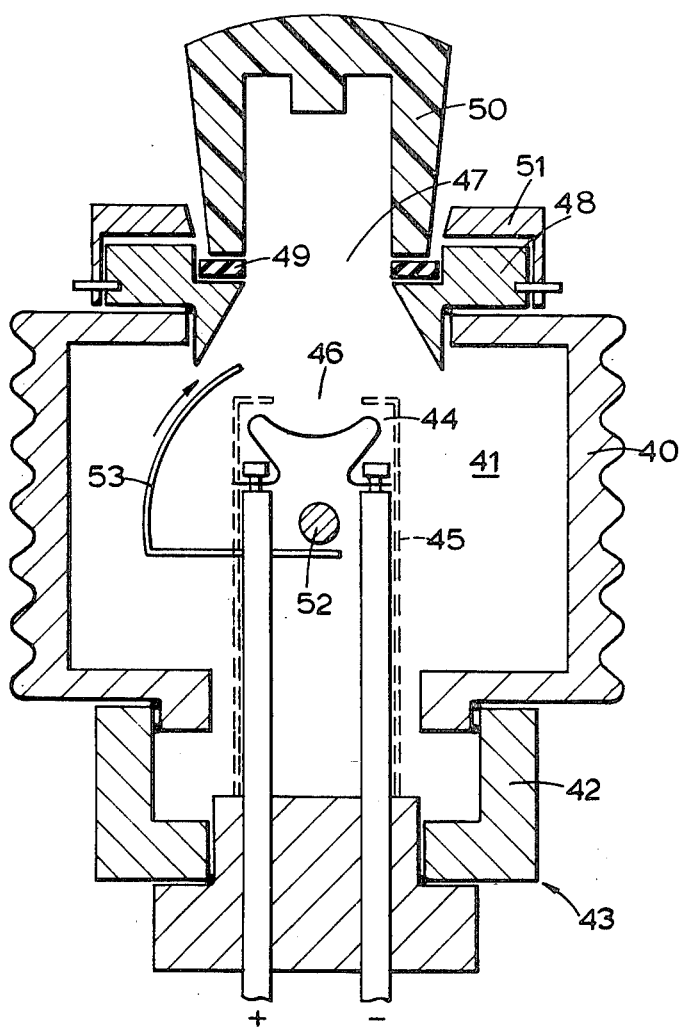
FIG. 5 is a schematic section of another evaporation unit for connection to the apparatus of FIG. 1 and 2.

In the alternative embodiment of evaporation unit depicted in FIG. 5, only one seating is provided and there is a special arrangement for controlling the disposition of the vaporised metal. This unit is particularly suitable for metals which include impurities that effect the coating, in particular gold.

The unit comprises a hollow body 40 providing a vacuum chamber 41. The hollow body may be water cooled or finned as shown. The body 40 is mounted vertically on the isolation valve body 10 by an elbow connection duct 42 which communicates with the front port 12 of the valve body 10, and which has a bore through which a heating assembly 43 may be withdrawn.

The heating assembly is similar to that first described, but includes a wire or strip filament 44 on which the metal to be vaporised is placed. The filament is enclosed by a sleeve 45 (depicted in dashed lines) and an aperture 46 is in the top end wall of the sleeve aligned with an opening 47 for a single seating spaced above the sleeve aperture.

The seating comprises a seating ring 48 inserted in sealed engagement in a through bore of the body 40. The seating ring 48 carries a flexible and resilient seal ring 49 on which the mouth of a hollow plastic tap knob 50 is seated. The seating ring has a tapered guide ring 51 connected thereto for centring the knob.

A pivot shaft 52 extends through the wall of the body and is rotatable by a handle (not shown) or other control external to the body. The shaft 52 carries a curved shutter 53 which is shown in the open position inside the vacuum chamber so as to leave an unobstructed path between the filament 44, the aperture 46 and the interior of the knob 50. The shutter 53 is movable to a closed position to obstruct said path so that during the initial stage of vaporisation the impurities in the metal which vaporise first are deposited on the shutter. Then the shutter can be opened to permit the deposition of the pure metal on the internal face of the knob.

As will be appreciated, in this unit, the cycle of operation is the same as first described, but the filament can be reloaded through the top of the body through the seating when the shutter is in the open position.

The shield can be omitted in this unit if desired as the shutter does fulfil some of the functions of the shield as described previously.

The shutter as depicted in FIG. 5 could be modified so as to be employed in the first described unit. Such modified shutter would include a different pivot shaft arrangement and would have a pair of opposed shutter surfaces to extend respective between one aperture in the shield and the adjacent seating.

As in the first unit, the seating ring is removable and can be interchangeable with seatings of different sizes.

In both types of unit, especially where the internal shape of the article to be coated is complex or there is mutual interference of the surfaces of the article and the dispersal direction of the metal from the filament, the filament may be arranged to rotate relative to the body. This may be achieved by a motor drive in or connected to the base of the heating element assembly.

Furthermore in both types of unit, the body may have a further connection to a high vacuum gauge and for certain applications there may be an inlet for minute dosing with argon. The gauge may be located on the reservoir or the duct of the pump connected to the body.

The body may also be provided with more than two seatings and can have any appropriate configuration of relatively small volume.

In the arrangements aforedescribed, a self-contained apparatus is provided and mounted on the portable stand or support ready for connection to an electrical mains supply and water, if water cooling is employed. The self-contained apparatus can be sited adjacent to a plastics moulding machine so as to provide an in-line production unit for vacuum metallising.

Alternatively, the high vacuum source may comprise a reservoir of substantially volume which is maintained at high vacuum by suitable pumps and the hollow body of the evaporation unit is connected to such reservoir by appropriate valves in accordance with the control sequence of operation. Thus the evaporation unit can comprise an attachment to an existing plant for vacuum metallising.

It will also be understood that in the case of tap bodies or control knobs, these are sufficiently strong to withstand the stresses of inducing high vacuum in their interiors. Special modifications to certain articles may be required to permit satisfactory performance in the apparatus.

I claim:

1. Apparatus for vacuum metallising the interior surface of hollow articles made of plastic material, the apparatus comprising a hollow body connected to a high vacuum source, a seating on said hollow body for engagement by a hollow plastic article so that the interior of said article and said hollow body are in communication, a heating assembly having a filament for vaporising coating metal mounted within said hollow body and a shield enclosing said heating assembly, said shield having an aperture aligned with said seating whereby vaporised coating metal is directed towards the interior of said plastic article.

2. Apparatus according to claim 1 wherein said seating comprises a seating ring mounted on said hollow body and a flexible seal supported on said seating ring and on which said article is engaged and drawn by high vacuum.

3. Apparatus according to claim 2 wherein said seating ring is releasably secured to said hollow body by a guide member having a tapered guide face to locate said article to be coated relative to said seating.

4. Apparatus according to claim 1 wherein said shield comprises a sleeve extending around said filament and an insulator block carrying said filament and mounting said sleeve.

5. Apparatus according to claim 4 wherein said heating assembly including said shield is detachably mounted on the hollow body and said shield is detachable from said insulator block.

6. Apparatus according to claim 1 wherein a shutter is mounted in said hollow body and is movable to obstruct the path of the vaporised coating metal from said filament to the interior of said article to be coated.

7. Apparatus according to claim 1 wherein said hollow body has a port in communication with a port of an isolation valve body, a valve member in said isolation valve body movable to close a communication between said hollow body port and a high vacuum oil diffusion pump.

8. Apparatus according to claim 7 wherein said isolation valve body has a second port in communication with a roughing valve operable to close a communication to a roughing mechanical pump.

9. Apparatus according to claim 8 wherein an air admittance valve is mounted in said communication between said isolation valve body and said roughing valve and a backing valve is connected between said oil diffusion pump and said mechanical pump.

* * * * *